United States Patent
Miyamoto

(10) Patent No.: US 10,134,559 B2
(45) Date of Patent: Nov. 20, 2018

(54) METHOD OF CLEANING ELECTRON SOURCE AND ELECTRON BEAM WRITING APPARATUS

(71) Applicant: NuFlare Technology, Inc., Yokohama-shi (JP)

(72) Inventor: Nobuo Miyamoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/211,124

(22) Filed: Jul. 15, 2016

(65) Prior Publication Data

US 2017/0032926 A1    Feb. 2, 2017

(30) Foreign Application Priority Data

Jul. 28, 2015  (JP) .................................. 2015-148735

(51) Int. Cl.
*H01J 37/06*    (2006.01)
*H01J 37/317*   (2006.01)

(52) U.S. Cl.
CPC .......... *H01J 37/06* (2013.01); *H01J 37/3174* (2013.01); *H01J 2237/022* (2013.01)

(58) Field of Classification Search
CPC .... H01J 2237/022; H01J 37/073; H01J 29/48; H01J 37/06; H01J 37/3174
See application file for complete search history.

(56) References Cited

U.S. PATENT DOCUMENTS

| | | | | |
|---|---|---|---|---|
| 5,539,211 A * | 7/1996 | Ohtoshi | ............... | B08B 7/0035 134/1.1 |
| 5,578,821 A * | 11/1996 | Meisberger | ............. | H01J 37/28 250/310 |
| 6,105,589 A * | 8/2000 | Vane | ..................... | B08B 7/0035 134/1.1 |
| 7,919,750 B2 * | 4/2011 | Yasuda | ................. | H01J 37/073 250/306 |
| 8,530,867 B1 * | 9/2013 | Nasser-Ghodsi | ..... | H01J 37/073 250/396 R |
| 2004/0159638 A1 * | 8/2004 | Demos | .................... | C23C 16/26 219/121.35 |

(Continued)

FOREIGN PATENT DOCUMENTS

| | | |
|---|---|---|
| JP | 59-8946 | 2/1984 |
| JP | 1-132036 | 5/1989 |

(Continued)

OTHER PUBLICATIONS

Office Action dated Aug. 21, 2018, in Japanese Patent Application 2015-148735, filed Jul. 28, 2015.

*Primary Examiner* — Jason McCormack
*Assistant Examiner* — Sean Luck
(74) *Attorney, Agent, or Firm* — Oblon, McClelland, Maier & Neustadt, L.L.P.

(57) ABSTRACT

In one embodiment, a method of cleaning an electron source included in an electron gun for an electron beam writing apparatus includes supplying an inert gas to an electron gun chamber, allowing the electron source to emit electrons, ionizing the inert gas with the electrons to produce ions, and removing contaminants deposited on the electron source by bombardment with the ions, and cutting off the supply of the inert gas based on a change in electron beam emission characteristic of the electron gun.

8 Claims, 4 Drawing Sheets

(56) References Cited

U.S. PATENT DOCUMENTS

| | | | | |
|---|---|---|---|---|
| 2006/0196525 A1* | 9/2006 | Vrtis | ............... | C23C 16/4405 |
| | | | | 134/1 |
| 2008/0217555 A1* | 9/2008 | Ward | ............... | H01J 27/26 |
| | | | | 250/423 F |
| 2010/0155619 A1* | 6/2010 | Koo | ............... | H01J 27/08 |
| | | | | 250/424 |
| 2011/0108058 A1* | 5/2011 | Srivastava | ............... | H01J 37/08 |
| | | | | 134/1.1 |
| 2012/0178025 A1* | 7/2012 | Tanaka | ............... | H01J 37/3177 |
| | | | | 430/296 |
| 2013/0126731 A1* | 5/2013 | Shichi | ............... | H01J 37/08 |
| | | | | 250/310 |
| 2014/0264019 A1* | 9/2014 | Adamec | ............... | H01J 37/073 |
| | | | | 250/310 |

FOREIGN PATENT DOCUMENTS

| | | |
|---|---|---|
| JP | 5-171423 | 7/1993 |
| JP | 2012-204173 | 10/2012 |

* cited by examiner

METHOD OF CLEANING ELECTRON SOURCE AND ELECTRON BEAM WRITING APPARATUS

CROSS REFERENCE TO RELATED APPLICATION

This application is based upon and claims benefit of priority from the Japanese Patent Application No. 2015-148735, filed on Jul. 28, 2015, the entire contents of which are incorporated herein by reference.

FIELD

The present invention relates to a method of cleaning electron source and an electron beam writing apparatus.

BACKGROUND

As LSI circuits are increasing in density, circuit linewidths of semiconductor devices are becoming finer year by year. To form a desired circuit pattern on a semiconductor device, a method is used which includes reducing the size of a high-accuracy original pattern (mask or also called a reticle that is used, in particular, in a stepper or a scanner) formed on quartz and transferring the pattern to a wafer with a reduced projection exposure apparatus. The high-accuracy original pattern is written through an electron beam writing apparatus by means of so-called electron beam lithography technology.

In an electron beam wiring apparatus, thermoelectrons emitted from an electron source included in an electron gun of the apparatus are accelerated into an electron beam by an acceleration voltage, and the electron beam is applied to a sample. A known technique for increasing the brightness of an electron gun includes covering the surface of a material for forming the electron gun with a material having a higher work function than the material for the electron gun to reduce the area of electron emission of the electron gun. For example, the surface of lanthanum hexaboride ($LaB_6$) constituting an electron source is covered with carbon (C), and electrons are emitted from a bare tip of the surface of lanthanum hexaboride.

Under high voltage application, abnormal discharge of an electron gun may be caused by discharge factors including a protrusion, such as a burr or a defect in the surface of an anode or a Wehnelt electrode, and contaminants, such as dust. Such abnormal discharge often occurs after mounting of a new electron gun, after replacement with a new electron gun, and after maintenance of an electron gun. To prevent abnormal discharge, an electron gun is typically subjected to conditioning (electrode electrical discharge machining) after mounting, replacement, or maintenance.

During conditioning treatment for an electron gun, discharge may occur between a Wehnelt electrode and a cathode, and contaminants including carbon may be deposited on the surface of the tip of an electron source. Under the electron gun, a current limiting aperture member made of, for example, tantalum or tungsten, is disposed. When the electron gun emits an electron beam, the current limiting aperture member may generate gas, and the generated gas may cause contaminants to be deposited on the surface of the tip of the electron source.

The contamination of the surface of the tip of the electron source with the contaminants obstructs the emission of an electron beam, degrading electron beam emission characteristics. Although heat treatment for removing such contaminants has been performed in the related art, the contaminant removal by heat treatment requires long time (over ten hours to several tens of hours), during which the operation of a writing apparatus needs to be stopped. This results in a reduction in availability.

DETAILED DESCRIPTION

In one embodiment, a method of cleaning an electron source included in an electron gun for an electron beam writing apparatus includes supplying an inert gas to an electron gun chamber, allowing the electron source to emit electrons, ionizing the inert gas with the electrons to produce ions, and removing contaminants deposited on the electron source by bombardment with the ions, and cutting off the supply of the inert gas based on a change in electron beam emission characteristic of the electron gun.

An embodiment of the present invention will be described below with reference to the drawings.

Figure 1:
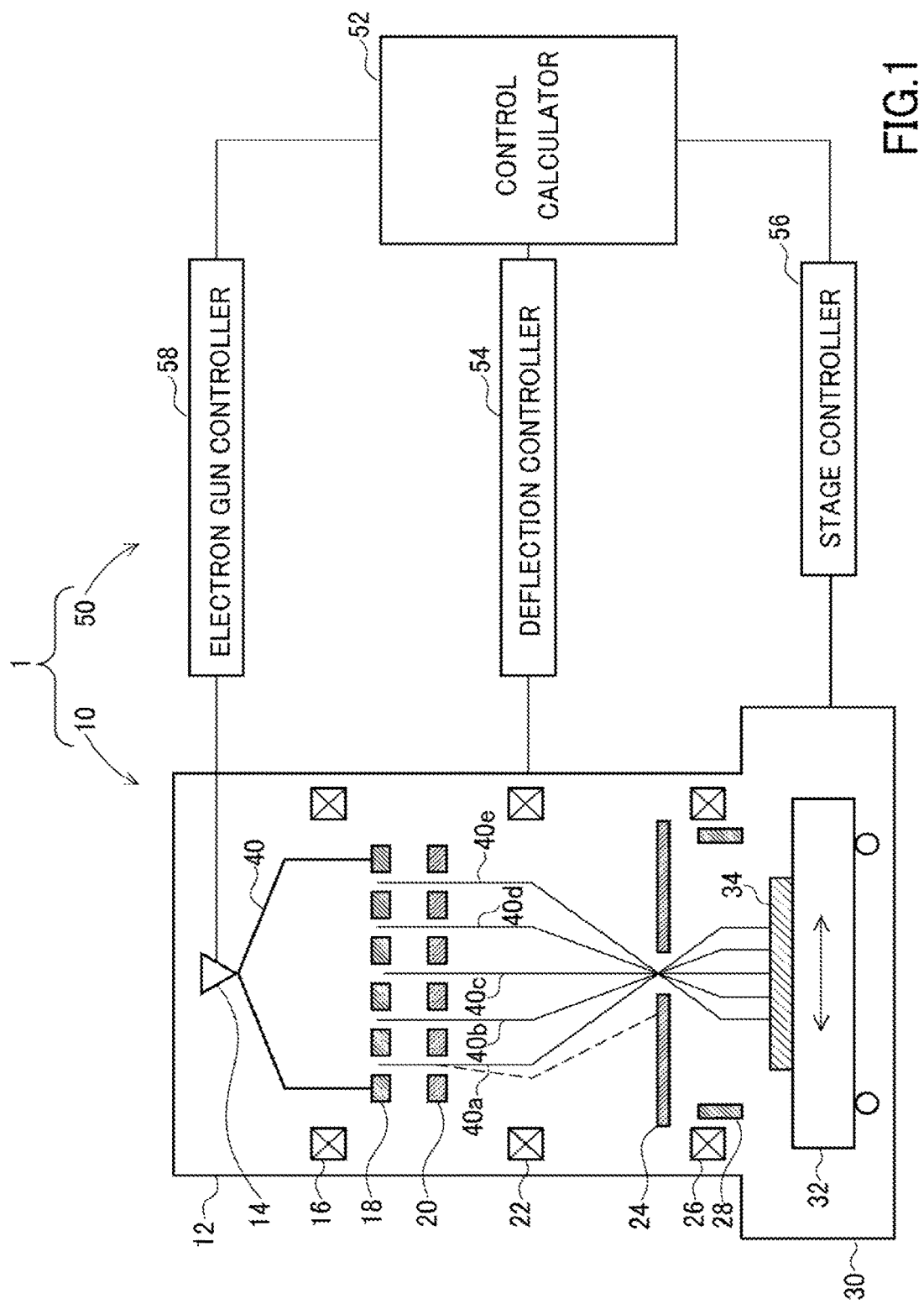
FIG. 1 is a block diagram illustrating an exemplary overall configuration of an electron beam writing apparatus according to an embodiment of the present invention.

FIG. 1 is a schematic diagram of an electron beam writing apparatus according to the present embodiment. In this embodiment, a configuration with multiple electron beams will be described as an example of an electron beam writing apparatus.

A writing apparatus 1 illustrated in FIG. 1 includes a writing unit 10 that irradiates an object, such as a mask or a wafer, with electron beams to write a desired pattern on the object, and a control unit 50 that controls an operation of the writing unit 10. The writing unit 10 includes an electron beam optical column 12 and a writing chamber 30.

The electron beam optical column 12 accommodates an electron gun 14, an illumination lens 16, an aperture member 18, a blanking plate 20, a reduction lens 22, a limiting aperture member 24, an objective lens 26, and a deflector 28. In addition, a current limiting aperture member (not illustrated) is disposed between the electron gun 14 and the illumination lens 16.

The writing chamber 30 accommodates an XY stage 32. A mask blank 34, serving as a writing target substrate, is placed on the XY stage 32. Examples of objects include a wafer and an exposure mask that is used for pattern transfer to a wafer with a reduced projection exposure apparatus or an extreme ultraviolet exposure apparatus, such as a stepper or a scanner, including an excimer laser as a light source. Examples of writing target substrates include a mask with a formed pattern. For example, a Levenson type mask requires two writing operations. A second pattern may be written to an object, serving as a processed mask on which a first pattern has already been written.

The control unit 50 includes a control calculator 52, a deflection controller 54, a stage controller 56, and an electron gun controller 58. The control calculator 52, the deflection controller 54, the stage controller 56, and the electron gun controller 58 are connected by a bus. At least part of the control unit 50 may be implemented in either hardware or software. When implemented in software, a program that realizes at least part of functions of the control unit 50 may be stored on a recording medium such as a flexible disk or CD-ROM and read and executed by a computer including electric circuits. The recording medium is not limited to a removable recording medium such as a magnetic disk or optical disk, but may be a non-removable recording medium such as a hard disk device or memory.

The electron gun 14 emits an electron beam 40. The current limiting aperture member shapes the electron beam 40 into a beam having a desired current density distribution. The illumination lens 16 allows the resultant electron beam 40 to be applied substantially perpendicular to the entirety of the aperture member 18 for forming multiple beams. The aperture member 18 has holes (openings) arranged in a matrix form at a predetermined pitch. The electron beam 40 passing through the current limiting aperture member is applied to an area including all of the holes of the aperture member 18. The electron beam 40 partly passes through these holes, thus forming multiple beams 40a to 40e as illustrated in FIG. 1.

The blanking plate 20 has passage holes aligned with the holes arranged in the aperture member 18. Each of the passage holes is provided with a blanker including two electrodes paired. Each of the electron beams 40a to 40e passing through the passage holes can be independently deflected by a voltage applied to the blanker. Such deflection achieves blanking control. As described above, some of the blankers perform blanking deflection of corresponding beams of the multiple beams passing through the holes of the aperture member 18.

The multiple beams 40a to 40e passing through the blanking plate 20 are reduced in size by the reduction lens 22 and then travel toward a central hole of the limiting aperture member 24. The electron beams deflected by the blankers of the blanking plate 20 are deviated from the central hole of the limiting aperture member 24 and are interrupted by the limiting aperture member 24. The electron beams, which have not been deflected by the blankers of the blanking plate 20, pass through the central hole of the limiting aperture member 24.

The limiting aperture member 24 interrupts the beams deflected in a beam-OFF mode by the blankers of the blanking plate 20. The beams passing through the limiting aperture member 24 for a period between the time when the beams enter a beam-ON mode and the time when the beams are changed to the beam-OFF mode correspond to a single shot of beam irradiation. The multiple beams 40a to 40e passed through the limiting aperture member 24 are focused by the objective lens 26, thus forming a pattern image reduced with a desired reduction rate. The beams (all of the multiple beams) passing through the limiting aperture member 24 are collectively deflected in the same direction by the deflector 28 and are then applied at beam irradiation positions on the mask blank 34.

While the XY stage 32 is continuously moved, the deflector 28 controls the beams such that the beam irradiation positions follow movement of the XY stage 32. The stage controller 56 controls the movement of the XY stage 32.

The control calculator 52 subjects write data to a multistage data conversion process, thus generating shot data specific to the apparatus. In the shot data, for example, an amount of radiation for each shot and the coordinates of each irradiation position are defined.

The control calculator 52 outputs data indicative of the amount of radiation for each shot based on the shot data to the deflection controller 54. The deflection controller 54 divides the amount of radiation, indicated by the input data, by a current density, thus obtaining irradiation time t. To achieve each shot, the deflection controller 54 applies a deflection voltage to the blankers, associated with the shot, in the blanking plate 20 so that the blankers provide the beam-ON mode only for the irradiation time t.

In addition, the control calculator 52 outputs deflection position data to the deflection controller 54 so that each beam is deflected to a position (coordinates) indicated by the shot data. The deflection controller 54 calculates an amount of deflection and applies a deflection voltage to the deflector 28. Consequently, the multiple beams corresponding to a shot at that time are collectively deflected.

Figure 2:
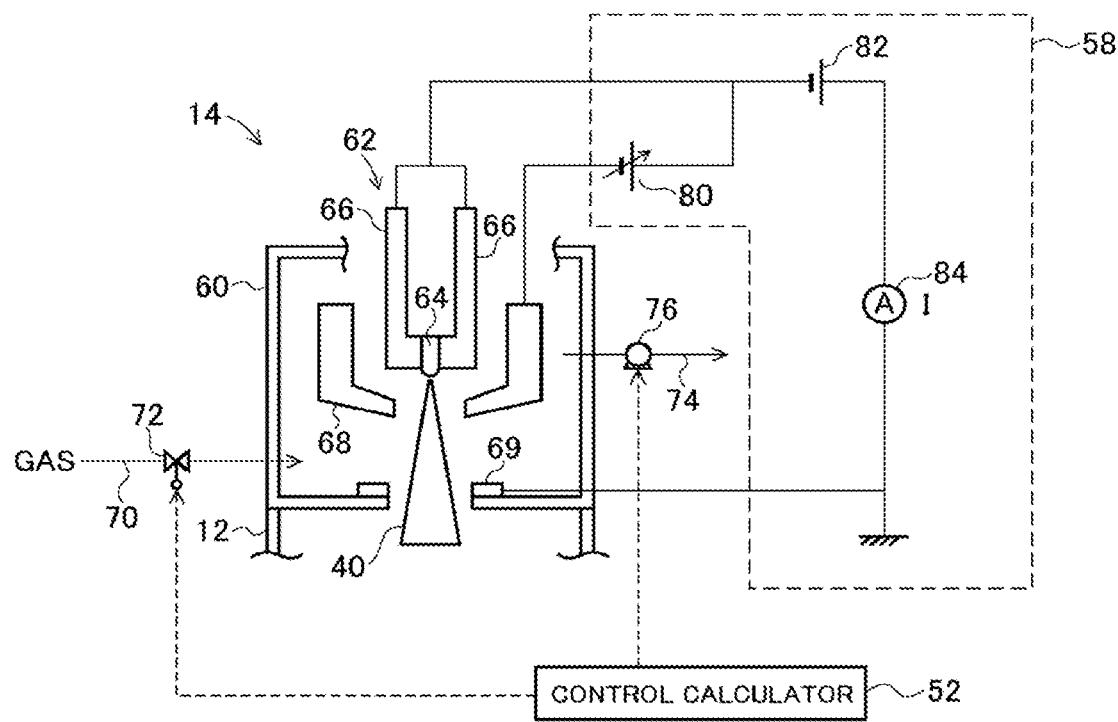
FIG. 2 is a schematic diagram illustrating an exemplary configuration of an electron gun in this embodiment.

FIG. 2 schematically illustrates an exemplary configuration of the electron gun 14 that emits the electron beam 40 and an exemplary configuration of the electron gun controller 58 connected to the electron gun 14. The electron gun 14, which is disposed on the top of the electron beam optical column 12, includes a cathode 62, a Wehnelt electrode 68, an anode 69, and an electron gun chamber (vacuum chamber) 60 that accommodates these components. The electron gun controller 58 includes a bias voltage power supply 80, an acceleration voltage power supply 82, and an ammeter 84.

The cathode 62 includes an electron source 64 comprising lanthanum hexaboride ($LaB_6$), single crystal cerium hexaboride ($CeB_6$), single crystal hafnium carbide (HfC), sintered $LaB_6$, sintered $CeB_6$, sintered HfC, sintered tungsten-barium-oxygen-Al (W—Ba—Al—O), or sintered scandate (Ba—Sc—W—O), and a pair of electrodes (heaters) 66 that sandwich the electron source 64. When a power supply (not illustrated) applies a voltage between the electrodes 66, the electron source 64 is heated to a high temperature. The electron source 64 has a surface covered with carbon and a bare tip (lower end).

The Wehnelt electrode 68 is disposed between the cathode 62 and the anode 69. The Wehnelt electrode 68 has an opening through which the electron beam 40 emitted from the electron source 64 passes. The anode 69 is grounded and its potential is set at the ground potential.

The acceleration voltage power supply 82 has a negative electrode (−) connected to the cathode 62 and a positive electrode (+), which is connected to the anode 69 and is also grounded (or connected to the ground). The negative electrode (−) of the acceleration voltage power supply 82 is also connected to a positive electrode (+) of the bias voltage power supply 80 through branching. The bias voltage power supply 80 has a negative electrode (−) connected to the Wehnelt electrode 68. The ammeter 84 is connected in series between the positive electrode (+) of the acceleration voltage power supply 82 and the anode 69 (or the ground).

The acceleration voltage power supply 82 applies an acceleration voltage between the cathode 62 and the anode 69. The bias voltage power supply 80 applies a bias voltage between the cathode 62 and the Wehnelt electrode 68.

When the electron source 64 is heated in a state in which the acceleration voltage power supply 82 applies a negative acceleration voltage to the cathode 62 and the bias voltage power supply 80 applies a negative bias voltage to the Wehnelt electrode 68, the electron source 64 emits electrons. The emitted electrons (group of electrons) are accelerated by the acceleration voltage, thus producing the electron beam 40. The electron beam 40 travels toward the anode 69, passes through the opening of the anode 69, and is then emitted from the electron gun 14. Consequently, emission current I flows between the cathode 62 and the anode 69.

The emission current I is measured by the ammeter 84. The control calculator 52 acquires a measurement from the ammeter 84. In addition, the control calculator 52 controls the bias voltage power supply 80 to control the bias voltage.

The electron gun chamber 60 is connected to one end of a gas supply pipe 70 included in a gas feeder for supplying nitrogen gas to the electron gun chamber 60. The other end of the gas supply pipe 70 is connected to a gas bomb (not illustrated). The gas supply pipe 70 is provided with a valve 72.

The electron gun chamber 60 is connected to a gas exhaust pipe 74 for exhausting the gas from the electron gun chamber 60. The gas exhaust pipe 74 is provided with a pump (vacuum pump) 76.

Opening and closing of the valve 72 and an operation of the pump 76 are controlled by the control calculator 52.

The electron gun 14 may be a single electron gun that includes a single electron source 64 as illustrated in FIG. 2 or may be a turret electron gun that includes multiple electron sources 64 arranged on a rotating member.

After mounting of a new electron gun 14 or after maintenance of the electron gun 14, the electron gun 14 is subjected to conditioning treatment. If discharge occurs between the Wehnelt electrode 68 and the cathode 62 during conditioning treatment, contaminants including carbon may be deposited on the surface of the tip of the electron source 64. Furthermore, when the electron gun 14 emits an electron beam, the current limiting aperture member, which is made of metal, such as tungsten or tantalum, disposed under the electron gun 14 is heated. The gas contained in the metal material may be released (gas release). The released gas may cause contaminants to be deposited on the surface of the tip of the electron source 64.

Figure 3:
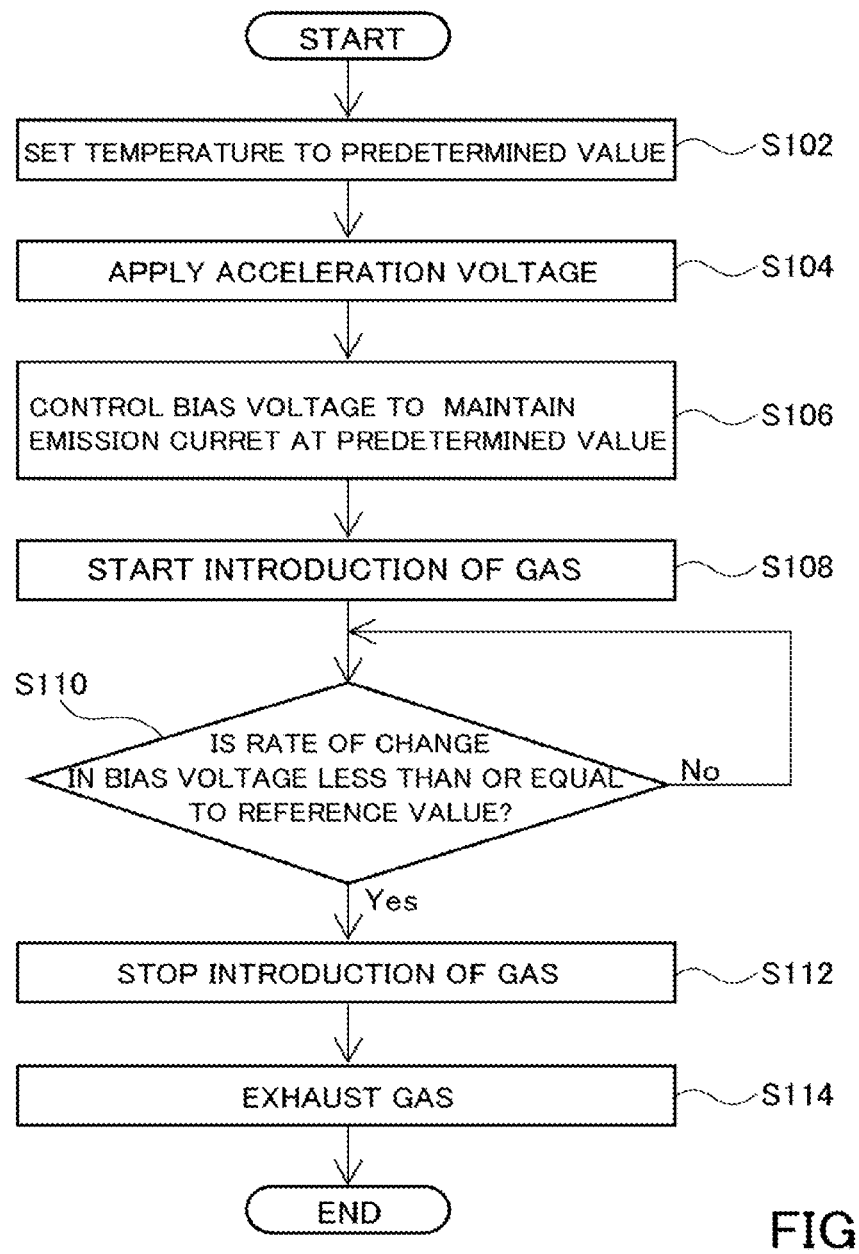
FIG. 3 is a flowchart explaining a method of cleaning an electron source in the embodiment.

The contamination of the surface of the tip of the electron source with the contaminants degrades electron beam emission characteristics. A cleaning method for effectively removing such contaminants will now be described with reference to FIG. 3.

For cleaning the electron source 64, the inside of the electron beam optical column 12 and the inside of the electron gun chamber 60 are set to a high vacuum state, and a voltage is applied between the electrodes 66 to heat the electron source 64 to a predetermined temperature (step S102). Furthermore, the acceleration voltage is applied between the cathode 62 and the anode 69 by using the acceleration voltage power supply 82 (step S104). The bias voltage (extraction voltage) is applied between the cathode 62 and the Wehnelt electrode 68 by using the bias voltage power supply 80 (step S106). For example, the acceleration voltage is approximately 50 kV. The control calculator 52 acquires a measurement from the ammeter 84 and controls the bias voltage to maintain the emission current I at a predetermined value (constant value). The heated electron source 64 emits thermoelectrons, which are accelerated into an electron beam by the acceleration voltage. The electron beam is then emitted.

The valve 72 is then opened to introduce the nitrogen gas into the electron gun chamber 60 through the gas supply pipe 70 (step S108). The electron beam collides with molecules of the introduced nitrogen gas, so that the gas is ionized (ionization). The contaminants deposited on the electron source 64 are gradually removed by bombardment with ions of nitrogen. The nitrogen gas is introduced at a constant flow rate so that the electron gun chamber 60 is maintained at a pressure of 0.01 Pa or higher.

Figure 4:
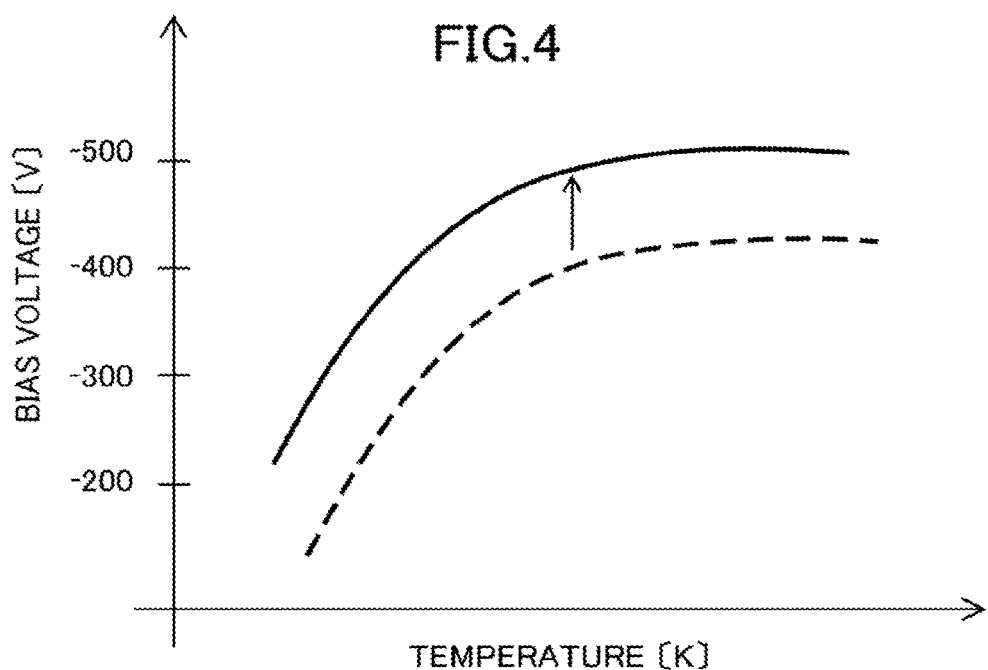
FIG. 4 is a graph illustrating the relationship between a cathode temperature and a bias voltage.

As the contaminants are removed, the electron beam emission characteristics of the electron gun 14 are improved. FIG. 4 is a graph illustrating the relationship between the temperature of the electron source 64 and the bias voltage at a constant emission current I. In FIG. 4, the broken line denotes the electron beam emission characteristic before improvement and the solid line denotes the improved characteristic.

As illustrated in FIG. 4, assuming that the emission current I and the temperature of the electron source 64 are constant, when the contaminants are removed from the surface of the electron source 64, the bias voltage increases. While the contaminants remain on the surface of the electron source 64 and they are continuously removed by ion bombardment, the bias voltage continues to change (increase). When the contaminants are sufficiently removed from the surface of the electron source 64, the bias voltage stops changing (increasing).

In the present embodiment, attention is paid to a change in the bias voltage under conditions where the emission current I and the temperature of the electron source 64 are constant, and the time of termination of the removal of contaminants from the surface of the electron source 64 is determined based on this change.

The control calculator 52 controls the bias voltage to keep the emission current I constant and also monitors the rate of change in the bias voltage. If the rate of change in the bias voltage is less than or equal to a predetermined reference value (e.g., 0.1 V/min) (Yes in step S110), the control calculator 52 determines that the contaminants have been sufficiently removed from the surface of the electron source 64, and closes the valve 72 to stop introducing the nitrogen gas (step S112).

If the rate of change in the bias voltage is greater than the predetermined reference value (No in step S110), the control calculator 52 determines that the contaminants remain on the surface of the electron source 64 and the contaminant removal by ion bombardment is continued, and continues to introduce the nitrogen gas. The amount of introduction of nitrogen gas has an upper limit at which a pressure in the electron gun chamber 60 is approximately 1 Pa.

After the introduction of the nitrogen gas is stopped, the nitrogen gas is exhausted from the electron gun chamber 60 with the pump 76 (step S114). Removing the contaminants from the surface of the electron source 64 prevents the degradation of the electron beam emission characteristics.

Since the contaminants are removed by ion bombardment in the present embodiment, the contaminants can be removed more efficiently than in the related-art contaminant removal by heat treatment. In addition, the time of termination of the cleaning process is determined based on a change in the bias voltage at a constant emission current I. Consequently, the cleaning process is prevented from being performed longer than necessary. This reduces the time required to remove contaminants and also prevents a reduction in availability of the writing apparatus. For example, the cleaning process in the present embodiment can reduce the time required to remove contaminants to approximately 30 minutes to approximately three hours.

Furthermore, immediately terminating the cleaning process upon removal of the contaminants prevents the electron source 64 from being reduced by ion bombardment.

Although the time of termination of the cleaning process is determined based on a change in the bias voltage at a constant emission current I in the embodiment, the time of termination of the cleaning process may be determined based on a change in the emission current I at a constant bias voltage.

Figure 5:
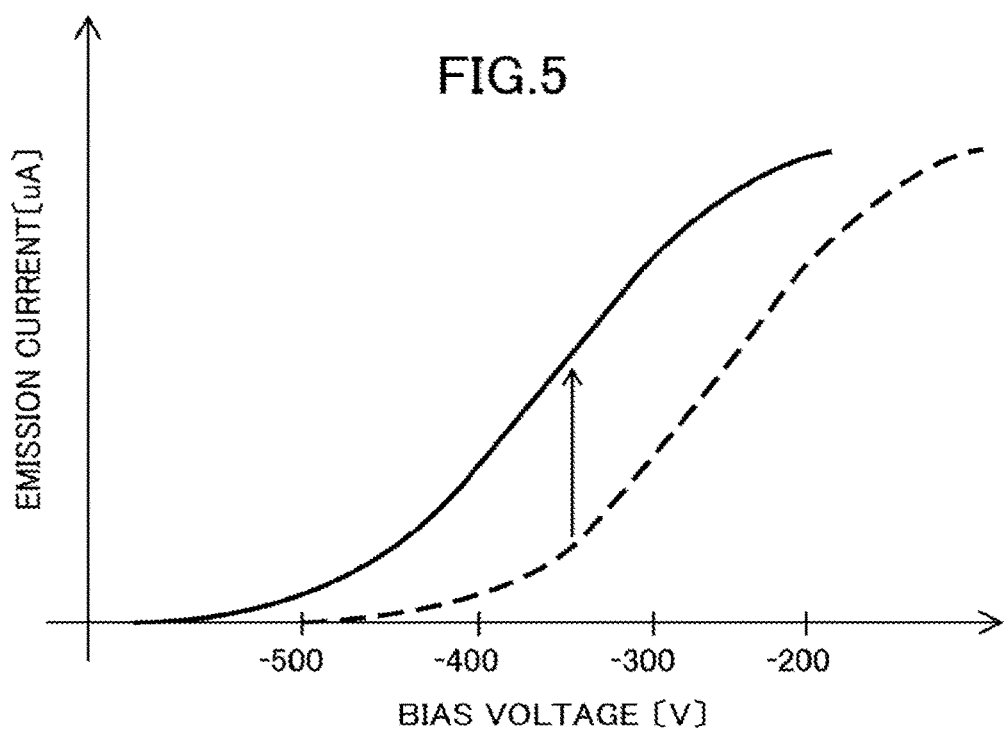
FIG. 5 is a graph illustrating the relationship between the bias voltage and an emission current.

FIG. 5 is a graph illustrating the relationship between the bias voltage and the emission current I at a constant temperature of the electron source 64. In FIG. 5, the broken line denotes the electron beam emission characteristic before improvement and the solid line denotes the improved characteristic.

As illustrated in FIG. 5, assuming that the bias voltage and the temperature of the electron source 64 are constant, when the contaminants are removed from the surface of the electron source 64, the emission current I increases. While the contaminants remain on the surface of the electron source 64 and they are continuously removed by ion bombardment, the emission current I continues to change (increase). When the contaminants are sufficiently removed from the surface of the electron source 64, the emission current I stops changing (increasing).

The control calculator 52 controls the bias voltage to keep the bias voltage constant and also monitors the rate of change in the emission current I. If the rate of change in the emission current I is less than or equal to a predetermined reference value (e.g., 0.01 μA/min), the control calculator 52 determines that the contaminants have been sufficiently removed from the surface of the electron source 64, and closes the valve 72 to stop introducing the nitrogen gas.

As described above, the time of termination of the cleaning process may be determined based on a change in emission current at a constant bias voltage. This enables the cleaning process to be immediately terminated upon removal of the contaminants.

A change in electron beam emission characteristic for determination of the time of termination of the cleaning process may be other than the rate of change in bias voltage at a constant emission current and the rate of change in emission current at a constant bias voltage. For example, a change in bias voltage at which the emission current starts to flow may be used. As illustrated in FIG. 5, a bias voltage at which the emission current starts to flow decreases with the removal of contaminants. When the bias voltage at which the emission current starts to flow is less than or equal to a predetermined value, the control calculator 52 determines that the contaminants have been sufficiently removed from the surface of the electron source 64, and closes the valve 72 to stop introducing the nitrogen gas.

The gas to be supplied to the electron gun chamber 60 for ion bombardment is not limited to the nitrogen gas. Another inert gas, such as argon gas, may be used.

Although the multi-beam writing apparatus has been described in the above embodiment, the present invention may be applied to a single-beam writing apparatus. Preferably, the present invention is applied to a multi-beam writing apparatus that requires large current. Although the configuration using an electron beam as an example of charged particle beams has been described, the charged particle beams are not limited to electron beams but may include ion beams.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of cleaning an electron source included in an electron gun for an electron beam writing apparatus, the method comprising:
   supplying an inert gas to an electron gun chamber;
   allowing the electron source to emit electrons, ionizing the inert gas with the electrons to produce ions, and removing contaminants deposited on the electron source by bombardment with the ions;
   cutting off the supply of the inert gas based on a change in electron beam emission characteristic of the electron gun;
   controlling a bias voltage applied to a Wehnelt electrode included in the electron gun to provide a constant emission current,
   wherein the supply of the inert gas is stopped when a rate of change in the bias voltage is less than or equal to a predetermined reference value.

2. The method according to claim 1, wherein while the contaminants deposited on the electron source are removed, the electron source is heated at a constant temperature.

3. The method according to claim 1, further comprising, after the stopping of the supply of the inert gas:
   exhausting the inert gas from the electron gun chamber.

4. An electron beam writing apparatus comprising:
   a cathode including an electron source;
   an anode connected to ground;
   a Wehnelt electrode disposed between the cathode and the anode;
   an acceleration voltage power supply applying an acceleration voltage between the cathode and the anode;
   a bias voltage power supply disposed between a negative electrode of the acceleration voltage power supply and the Wehnelt electrode such that the bias voltage power supply is electrically connected to the negative electrode and the Wehnelt electrode, the bias voltage power supply applying a bias voltage to the Wehnelt electrode;
   an ammeter measuring an emission current;
   a gas feeder supplying an inert gas to an electron gun chamber;
   a controller that allows the electron source to emit electrons, ionizes the inert gas, supplied from the gas feeder, with the electrons to produce ions, removes contaminants deposited on the electron source by bombardment with the ions, and stops the supply of the inert gas based on a change in the bias voltage or the emission current; and
   a writer writing a pattern on a target with an electron beam produced by accelerating the electrons emitted from the electron source through the acceleration voltage.

5. The apparatus according to claim 4, wherein the controller controls the bias voltage power supply to keep the emission current constant, and stops the supply of the inert gas when a rate of change in the bias voltage is less than or equal to a predetermined reference value.

6. The apparatus according to claim 4, wherein the controller controls the bias voltage power supply to keep the bias voltage constant, and stops the supply of the inert gas when a rate of change in the emission current is less than or equal to a predetermined reference value.

7. The apparatus according to claim 4, wherein the controller stops the supply of the inert gas when a bias voltage at which the emission current starts to flow is less than or equal to a predetermined value.

8. The apparatus according to claim 4, wherein the writer includes an aperture member having a plurality of openings that form multiple beams upon irradiation with the electron beam.

* * * * *